(12) United States Patent
Yasuda et al.

(10) Patent No.: US 7,212,007 B2
(45) Date of Patent: *May 1, 2007

(54) ELECTRIC POTENTIAL SENSOR, AND IMAGE FORMING APPARATUS

(75) Inventors: Susumu Yasuda, Tokyo (JP); Takashi Ushijima, Kanagawa (JP); Yoshitaka Zaitsu, Kanagawa (JP); Yoshikatsu Ichimura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/222,837

(22) Filed: Sep. 12, 2005

(65) Prior Publication Data

US 2006/0001432 A1 Jan. 5, 2006

Related U.S. Application Data

(62) Division of application No. 10/798,315, filed on Mar. 12, 2004, now Pat. No. 6,965,239.

(30) Foreign Application Priority Data

Mar. 28, 2003 (JP) ............................. 2003-089464

(51) Int. Cl.
*G01R 29/12* (2006.01)
(52) U.S. Cl. ...................... 324/458; 324/660
(58) Field of Classification Search ............... None
See application file for complete search history.

(56) References Cited

U.S. PATENT DOCUMENTS 4,149,119 A  4/1979  Buchheit ................. 324/458
5,241,276 A * 8/1993 Tanaka et al. ............. 324/452
5,517,123 A  5/1996  Zhao et al. ................ 324/458
6,177,800 B1 1/2001 Kubby et al. ............. 324/458
6,215,318 B1 4/2001 Schoefthaler et al. ...... 324/658
6,806,717 B2 * 10/2004 Werner et al. ............ 324/458

FOREIGN PATENT DOCUMENTS

JP    2000-147035    5/2000

* cited by examiner

*Primary Examiner*—Vincent Q. Nguyen
(74) *Attorney, Agent, or Firm*—Fitzpatrick, Cella, Harper & Scinto

(57) ABSTRACT

Disclosed in a non-contacting electric potential sensor capable of being readily reduced in its size, which includes a detecting electrode, an electrically-conductive movable shutter, and a driving unit for driving the electrically-conductive movable shutter. The detecting electrode is to be placed facing a measurement object whose electric potential is to be measured. The electrically-conductive movable shutter is disposed so as to be movably located in a spacing formed between the detecting electrode and the measurement object when the detecting electrode is placed facing the measurement object, so that an exposure degree of the detecting electrode against the measurement object can be controlled. The driving unit includes a current injecting unit for selectively injecting current into the electrically-conductive movable shutter in a direction approximately perpendicular to a moving direction of the electrically-conductive movable shutter.

7 Claims, 10 Drawing Sheets

DIRECTION OF MAGNETIC FLUX

DIRECTION OF MAGNETIC FLUX

ELECTRIC POTENTIAL SENSOR, AND IMAGE FORMING APPARATUS

This application is a divisional of application Ser. No. 10/798,315, filed Mar. 12, 2004, now U.S. Pat. No. 6,965,239, the contents of which are incorporated by reference herein.

BACKGROUND OF THE INVENTION

1. Field of the Invention

The present invention relates to a non-contacting electric potential sensor capable of being fabricated using micro-electro-mechanical-systems (MEMS) technology, and an image forming apparatus using the electric potential sensor.

2. Description of the Related Background Art

As a sensor for measuring a surface electric potential of an object to be measured (a measurement object), a variable capacitive coupling electric potential sensor of a mechanical type is known. FIG. 9 shows a principle of the mechanical type variable capacitive coupling potential sensor. A measurement object 1099 has an electric potential V relative to a ground potential. A detecting electrode 1021 is disposed facing the measurement object, and a movable shutter 1025 is arranged right above the detecting electrode 1021. Upon motion of the movable shutter 1025, an electrostatic capacitance C between the measurement object 1099 and the detecting electrode 1021 is changed. An electrical charge Q is induced in the detecting electrode 1021 in accordance with V and C. Current flowing between the detecting electrode 1021 and the ground is detected by an ampere meter 1060.

Here, the amount of the electrical charge Q induced in the detecting electrode 1021 satisfies a relation $Q=CV$. Accordingly, current i flowing into the ampere meter 1060 is given by $i=dQ/dt=VdC/dt$ where t is the time. The potential V can be obtained if $dC/dt$ is known. The sensitivity of the sensor is represented by $dC/dt$. As can be understood from that relation, the sensitivity increases if a difference between maximum and minimum of C is increased, or changing time t is shortened.

In connection with the above-discussed mechanical type variable capacitive coupling potential sensor capable of being fabricated using the MEMS technology, the following construction is disclosed by Japanese Patent Application Laid-Open No. 2000-147035 (its U.S. counterpart is U.S. Pat. No. 6,177,800). FIG. 10 illustrates an electric potential sensor 1001. The sensor 1001 is comprised of a driver component 1010 and a sensor component 1020. Those components can be fabricated on a substrate 1004 by the MEMS technology.

The driver component 1010 is comprised of a suspension 1018 having a parallel hinge structure, and a comb electrostatic actuator 1012. The comb electrostatic actuator 1012 is a general mechanism for driving a minute structure in an electrostatic manner, and is comprised of a movable electrode 1013 supported by the suspension 1018, and a stationary electrode 1014 attached to the substrate 1004. The comb electrostatic actuator 1012 is electrically connected to an electrostatic drive signal source 1050. The movable electrode 1013 is held by the suspension 1018 movably in right and left directions in FIG. 10. Comb-shaped electrodes of the movable electrode 1013 are in alternate mesh engagement with those of the stationary electrode 1014 with these two sets of Comb-shaped electrodes being spaced. Upon application of a potential difference between those two sets of Comb-shaped electrodes, electrostatic attractive force acts between those electrodes 1013 and 1014.

The sensor component 1020 is connected to the driver component 1010. A detecting electrode assembly 1021 is fixed to the substrate 1004, and is capable of capacitive coupling to a surface of an object to be measured. The detecting electrode assembly 1021 is composed of a set of spaced detecting electrodes 1021a, 1021b and 1021c. Those detecting probes are connected together such that individual signals can be combined or superimposed. The sensor component 1020 further includes a movable shutter 1025 which selectively covers the detecting electrode assembly 1021. The movable shutter 1025 is mechanically connected to the driver component 1010 such that a linear displacement of the driver component 1010 can cause a corresponding displacement of the movable shutter 1025.

The movable shutter 1025 has a plurality of openings 1024. The movable shutter 1025 is constructed such that the detecting electrode assembly 1021 can be selectively exposed through the openings 1024 when the movable shutter 1025 takes a first position. The openings 1024 are spaced from each other by a distance corresponding to the spacing between the detecting electrodes. When the movable shutter 1025 takes a second position, the detecting electrode assembly 1021 is covered with shielding portions 1026 present between the openings 1024.

In other words, when the movable shutter 1025 takes the first position, capacitive coupling between the detecting electrode assembly 1021 and the measurement object can be established. On the other hand, when the movable shutter 1025 takes the second position, capacitive coupling between the detecting electrode assembly 1021 and the measurement object is masked and prohibited. Current created by the detecting electrode assembly 1021 is output into a takeout electrode 1028, and is amplified by an amplifier 1060.

FIG. 11 is a cross-sectional view taken along a line 1080 of FIG. 10. As can be seen from FIG. 11, widths w1 of the respective detecting electrode of the detecting electrode assembly 1021 must be arranged with being spaced from each other by a distance w2 corresponding to the distance between the respective shutter openings 1024. Therefore, the width w1 is equal to the distance w2, and accordingly the effective area of the detecting electrodes is about a half of the area occupied thereby on the substrate.

As discussed above, the MEMS electrostatic sensor has the following disadvantages to be solved. In the first place, the driver component 1010 and the sensor component 1020 of the conventional MEMS electrostatic sensor are fabricated at different locations on the substrate 1004, respectively, and accordingly the chip size is liable to increase irrespective of their arrangement manner. Therefore, there is a limitation to reduction of the size of the conventional MEMS electrostatic sensor, and its cost increases.

Further, since the driver component 1010 and the sensor component 1020 move together, mass of a movable portion is likely to increase, and it is hence difficult to increase the driving frequency. The detecting sensitivity dC/dt of the electrostatic sensor is also proportional to the driving frequency, and accordingly the detecting sensitivity is difficult to increase.

SUMMARY OF THE INVENTION

It is an object of the present invention in view of the above-described disadvantages to provide an electric potential sensor which is to be used facing an object whose electric potential is to be measured (a measurement object).

According to one aspect of the present invention, there is provided a potential sensor which includes a detecting electrode, an electrically-conductive movable shutter which is disposed such that it can be movably located in a spacing formed between the detecting electrode and a measurement object, when the detecting electrode is placed facing the measurement object, to control an exposure degree of the detecting electrode against the measurement object, and a driving unit for driving the electrically-conductive movable shutter, which includes a current injecting unit for selectively injecting current into the electrically-conductive movable shutter. In such a construction, the electrically-conductive movable shutter itself constitutes a portion of an actuator, so that there is no need to provide an actuator unit in a totally separate form, leading to a decrease in its size. Further, even when a plurality of electrically-conductive movable shutters are arranged, the individual electrically-conductive movable shutters can be independently moved, so that mass of a movable portion can be lightened. Accordingly, its moving speed can be increased, and the sensitivity of the sensor can be hence enhanced. Moreover, no high voltage is needed to drive the electrically-conductive movable shutter, and accordingly the cost of the driving unit can be reduced.

The following specific structures are possible on the basis of the above fundamental construction.

The driving unit can include a magnetic-field applying unit for applying a magnetic field to the electrically-conductive movable shutter in a direction approximately perpendicular to a direction of the current injection and a moving direction of the electrically-conductive movable shutter. The magnetic-field applying unit can be a permanent magnet, or an electromagnetic coil.

It is possible to adopt a construction in which at least two electrically-conductive movable shutters and at least two current injecting units are provided, and the electrically-conductive movable shutters are movable owing to interaction between the currents which are injected into the electrically-conductive movable shutters by the current injecting units, respectively, in a direction approximately perpendicular to a moving direction of the electrically-conductive movable shutter. Also in such a construction, the electrically-conductive movable shutters constitute a portion of the actuator, so that there is no need to provide an actuator unit in a totally separate form, leading to a decrease in its size. Further, the individual electrically-conductive movable shutters can be independently moved, so that mass of the movable portion can be lightened. Accordingly, its moving speed can be increased, and the sensitivity of the sensor can be hence enhanced. Moreover, no high voltage is needed to drive the electrically-conductive movable shutters, and accordingly the cost of the driving unit can be reduced.

When the electrically-conductive movable shutter is shaped into an electrically-conductive movable shutter which is elastically supported movably, the movable shutter can be moved without its motion being disturbed by friction. Further, when the structure is constructed such that the driving frequency of the electrically-conductive movable shutter can be approximately equalized with its mechanical resonance frequency, consumption of electrical power for achieving a given amplitude of the motion can be largely reduced.

Further, it is possible to construct a structure in which there are arranged first and second detecting electrodes which are to be placed facing the measurement object, and a differential processing unit for differentially processing outputs supplied from the first and second detecting electrodes, the electrically-conductive movable shutter can selectively take a first state or a second state, the first detecting electrode is exposed to the measurement object more (typically, exposed approximately entirely) at the time when the electrically-conductive movable shutter takes the first state than at the time when the electrically-conductive movable shutter takes the second state, and the second detecting electrode is exposed to the measurement object less (typically, shielded approximately entirely) at the time when the electrically-conductive movable shutter takes the first state than at the time when the electrically-conductive movable shutter takes the second state. In such a construction, the first and second detecting electrodes can be disposed close to each other, so that the effective area of the detecting electrode can be increased. Further, since the outputs from the first and second detecting electrodes are differentially processed to obtain a signal, the sensitivity can be increased even if the size is relatively small.

Further, it is possible to construct a structure in which there are arranged a substrate, first and second detecting electrode assemblies which are provided on the substrate, and at least one of which is comprised of a plurality of portions, and at least one movable shutter which is disposed above the first and second detecting electrode assemblies with a spacing being provided therebetween, the first detecting electrode assembly is exposed to the measurement object more at the time when the movable shutter takes the first state than at the time when the movable shutter takes the second state, and the second detecting electrode assembly is exposed to the measurement object less at the time when the movable shutter takes the first state than at the time when the movable shutter takes the second state. While each of the first and second detecting electrodes can be composed of a single portion, the effective area of the detecting electrode can be further increased in the event of such a construction.

Furthermore, it is possible to construct a structure in which the detecting electrode is comprised of a detecting electrode assembly consisting of a plurality of portions, and a plurality of electrically-conductive movable shutters are arranged. In such a construction, the effective area of the detecting electrode can be increased.

According to another aspect of the present invention, there is provided an image forming apparatus which includes the above-described electric potential sensor, and an image forming unit for controlling formation of an image based on an output of the electric potential sensor. In such an image forming apparatus, technical advantages of the above-described electric potential sensor are effectively utilized. The image forming unit has a function of copying, printing, or facsimile, for example. Further, the image forming unit can be constructed as a structure which includes a photosensitive drum, and in which an electrified potential on the photosensitive drum is measured by using the electric potential sensor placed facing the photosensitive drum.

These advantages, as well as others, will be more readily understood in connection with the following detailed description of the preferred embodiments and examples of the invention in connection with the drawings.

DESCRIPTION OF THE PREFERRED EMBODIMENTS

Embodiments of an electric potential sensor and an image forming apparatus of the present invention will be hereinafter described with reference to the drawings.

Figure 1:
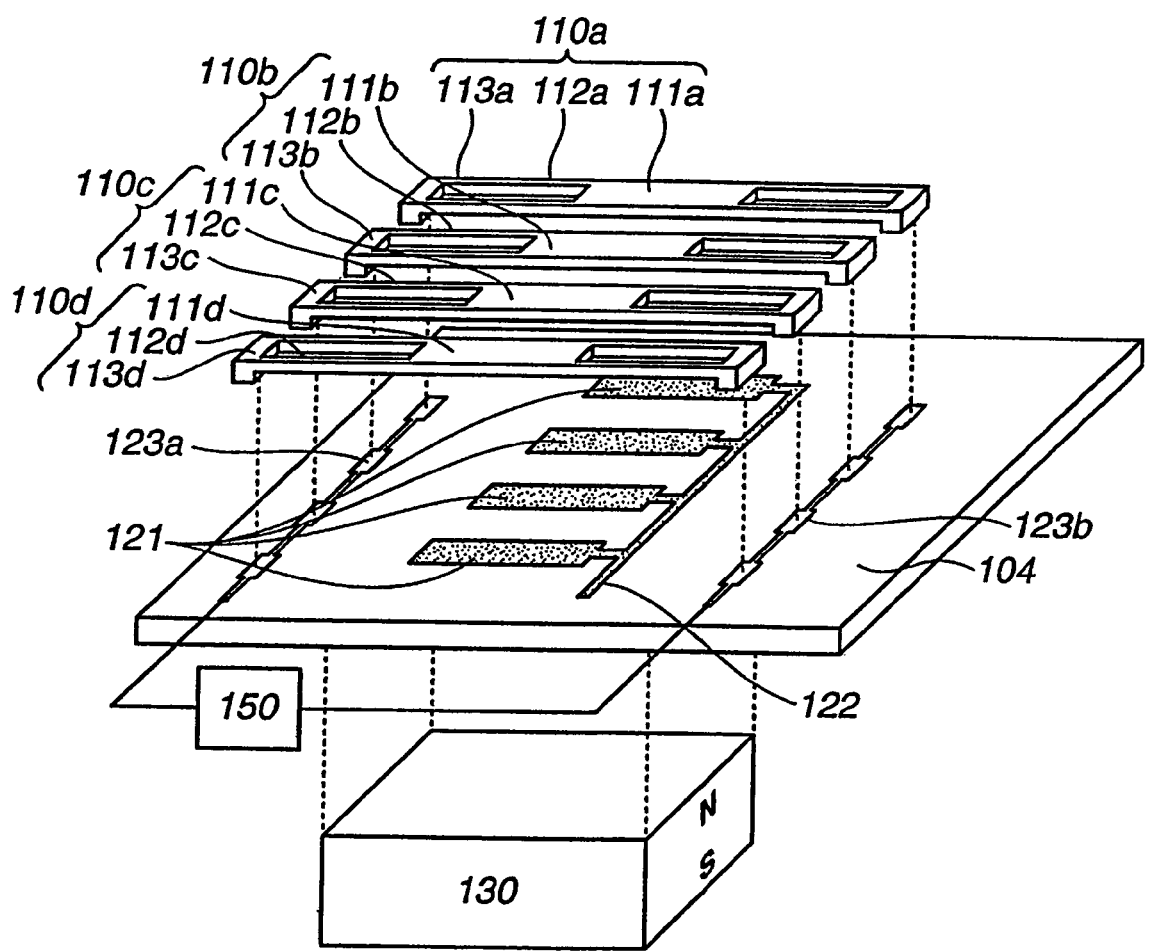
FIG. 1 is a disassembled perspective view illustrating a first embodiment of an electric potential sensor according to the present invention.

FIG. 1 illustrates a disassembled structure of a first embodiment directed to an electric potential sensor. As illustrated in FIG. 1, a detecting electrode assembly 121, a takeout electrode 122 for the detecting electrode assembly 121, and takeout electrodes 123a and 123b for driving are patterned on a substrate 104. The detecting electrode assembly 121 consists of a set of detecting electrodes which are spaced from each other and electrically connected to each other.

Movable shutter units 110a to 110d are comprised of shielding members 111a to 111d, parallel hinge suspensions 112a to 112d, and fixing members 113a to 113d, respectively. Those portions 111a to 111d, 112a to 112d, and 113a to 113d are formed in a united form with electrically-conductive material, respectively. Each of the fixing members 113a to 113d is fixedly bonded to the driving takeout electrodes 123a and 123b. The shielding members 111a to 111d are supported by the parallel hinge suspensions 112a to 112d with being spaced from the detecting electrode assembly 121 disposed below the shielding members 111a to 111d, respectively. The movable shutter units 110a to 110d are electrically connected in a parallel manner through the driving takeout electrodes 123a and 123b.

A permanent magnet 130 is disposed under the substrate 104. The magnet 130 generates a magnetic flux in a direction perpendicular to the substrate 104. The driving takeout electrodes 123a and 123b are electrically connected to a driver 150.

Figure 2A:
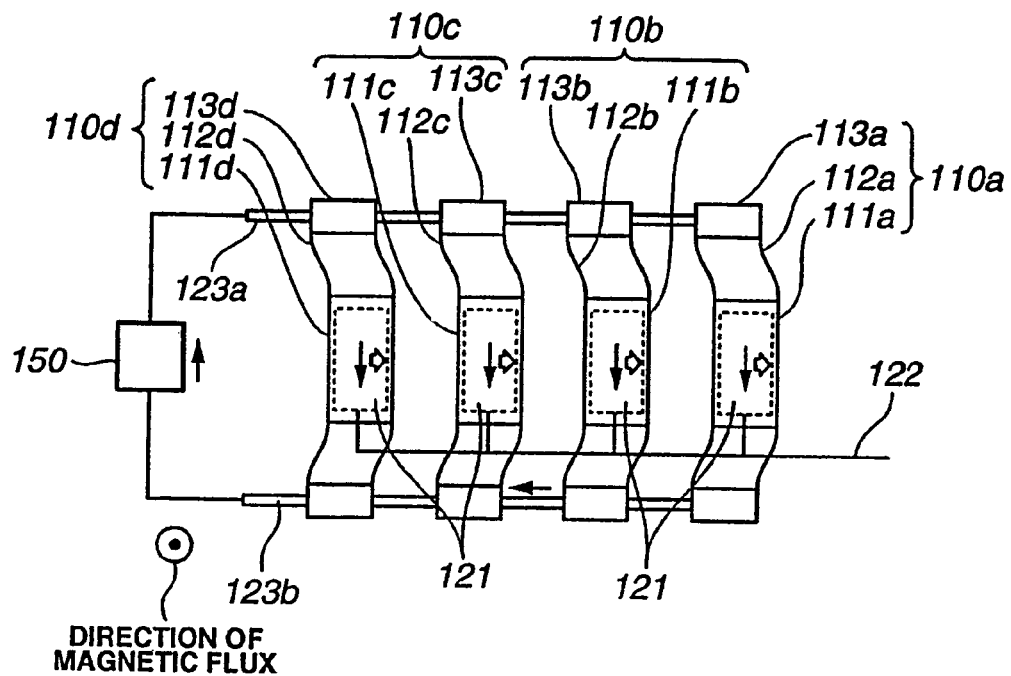
FIG. 2 is a view explaining the operation of the first embodiment.

Operation of the electric potential sensor of the first embodiment will be described with reference to FIGS. 2A and 2B. An object to be measured (a measurement object) is placed above the substrate 104 and in a direction perpendicular to the substrate 104. In the event that current is generated from the driver 150 and is caused to flow from the driving takeout electrode 123a to the driving takeout electrode 123b as illustrated in FIG. 2A, the movable shutter units 110a to 110d (more exactly the shielding members 111a to 111d) are displaced rightward in FIG. 2A under the influence of the magnetic field generated perpendicularly to a sheet of the figure. The detecting electrode assembly 121 is accordingly shielded, so that the electrostatic capacitive coupling between the assembly 121 and the measurement object decreases.

Figure 2B:
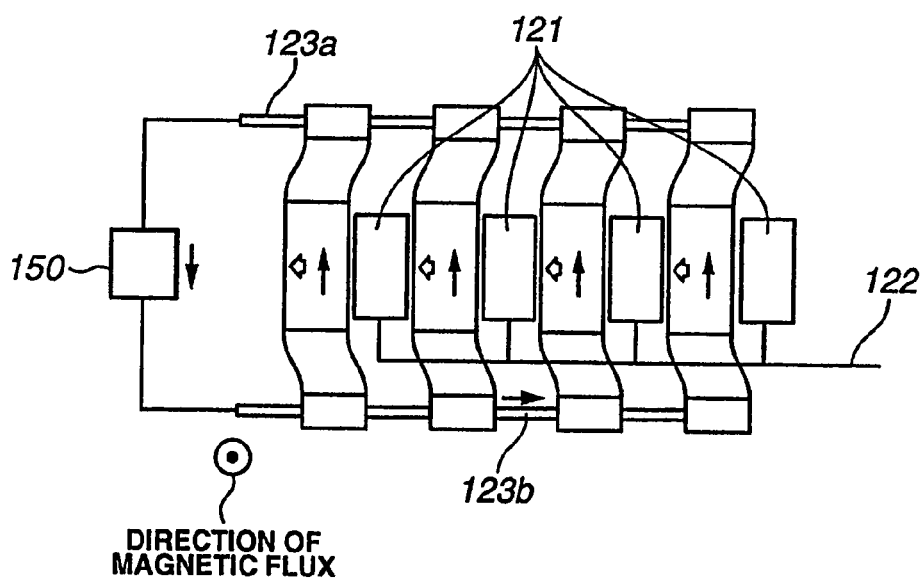

Conversely, in the event that current is caused to flow from the driving takeout electrode 123b to the driving takeout electrode 123a as illustrated in FIG. 2B, the movable shutter units 110a to 110d (more exactly the shielding members 111a to 111d) are displaced leftward in FIG. 2A under the influence of the magnetic field. The detecting electrode assembly 121 is accordingly exposed, so that the electrostatic capacitive coupling between the assembly 121 and the measurement object increases. Upon repetition of those motions, electrical charges are alternately induced in the detecting electrode assembly 121. An electric potential of the measurement object can be measured by detecting the charges.

When the driving frequency of the movable shutter units 110a to 110d is made approximately equal to the mechanical resonance frequency, electrical power needed for the driving can be reduced.

In a construction according to the first embodiment, the movable shutter itself constitutes a portion of an actuator, so that there is no need to provide an actuator unit in a separate form on the substrate, leading to a decrease in its size. Therefore, when the size is approximately equivalent to that of a conventional sensor, the sensitivity can be increased. Further, in the event that the sensitivity only needs to be equivalent to that a conventional sensor, the size can be reduced. Moreover, the fabrication cost can be decreased by increasing the number of sensors per a silicon wafer.

Furthermore, since the individual movable shutters are independently moved, mass of a movable portion can be lightened. Accordingly, the motion speed can be increased, and hence the sensor sensitivity can be enhanced. In addition, no high voltage is needed to drive the movable shutters, and accordingly the cost of the driver can be reduced.

Figure 3:
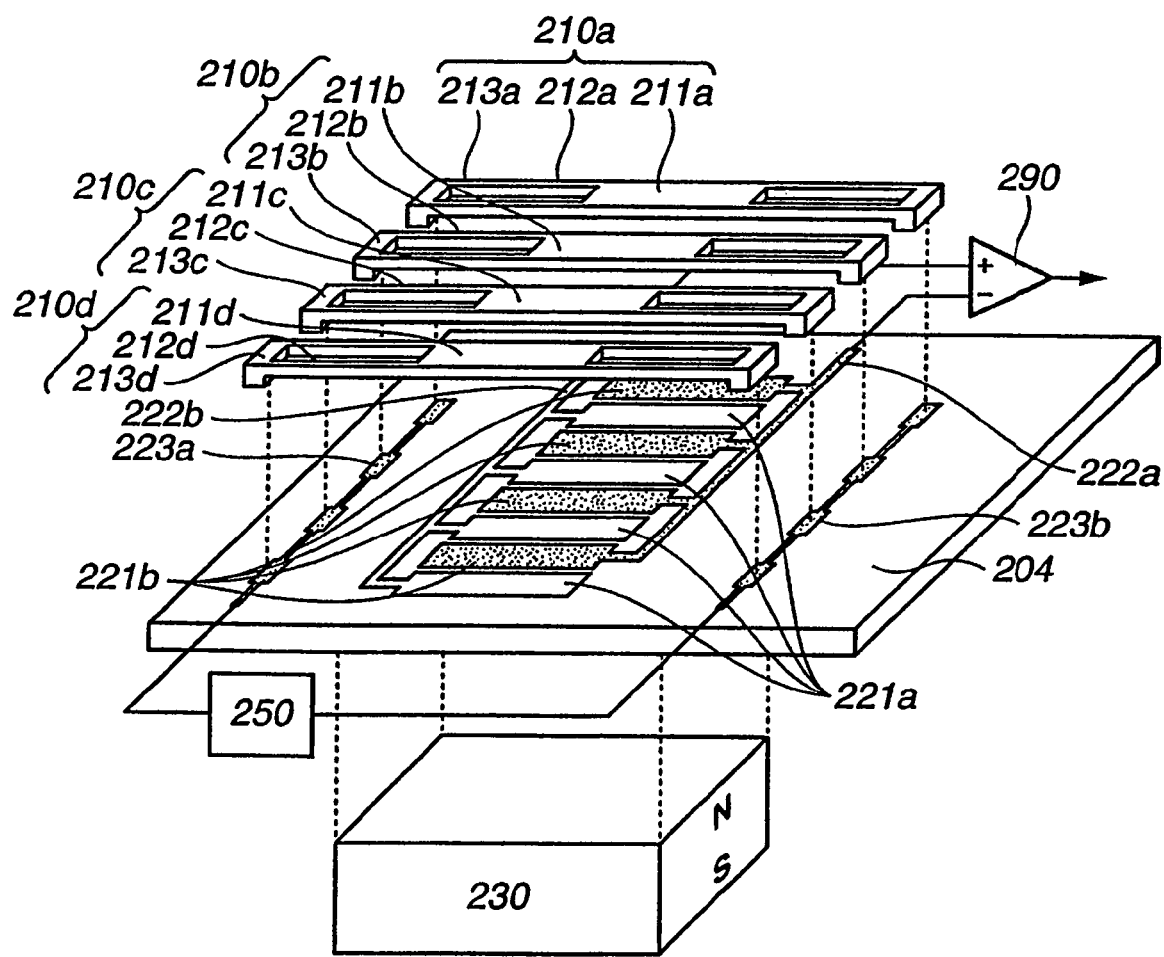
FIG. 3 is a disassembled perspective view illustrating a second embodiment of an electric potential sensor according to the present invention.

FIG. 3 illustrates a disassembled structure of a second embodiment directed to an electric potential sensor. As illustrated in FIG. 3, two detecting electrode assemblies 221a and 221b, takeout electrodes 222a and 222b for the detecting electrode assemblies 221a and 221b, and takeout electrodes 223a and 223b for driving are patterned on a substrate 204. Each of the detecting electrode assemblies 221a and 221b consists of a set of detecting electrodes which are spaced from each other and electrically connected to each other by each of the takeout electrodes 222a and 222b for the detecting electrode assemblies 221a and 221b. Detecting electrodes of the detecting electrode assemblies 221a and 221b are spaced from each other such that they cannot be electrically shorted therebetween.

Movable shutter units 210a to 210d are comprised of shielding members 211a to 211d, parallel hinge suspensions 212a to 212d, and fixing members 213a to 213d, respectively. Those portions 211a to 211d, 212a to 212d, and 213a to 213d are formed in a united form with electrically-conductive material, respectively. Each of the fixing members 213a to 213d is fixedly bonded to the driving takeout electrodes 223a and 223b. The shielding members 211a to 211d are supported by the parallel hinge suspensions 212a to 212d with being spaced from the detecting electrode assemblies 221a and 221b disposed below the shielding members 211a to 211d, respectively.

A permanent magnet 230 is disposed under the substrate 204. The magnet 230 generates a magnetic flux in a direction perpendicular to the substrate 204. The driving takeout electrodes 223a and 223b are electrically connected to a driver 250. The detecting electrode takeout electrodes 222a and 222b are electrically connected to a differential amplifier 290.

Figure 4A:
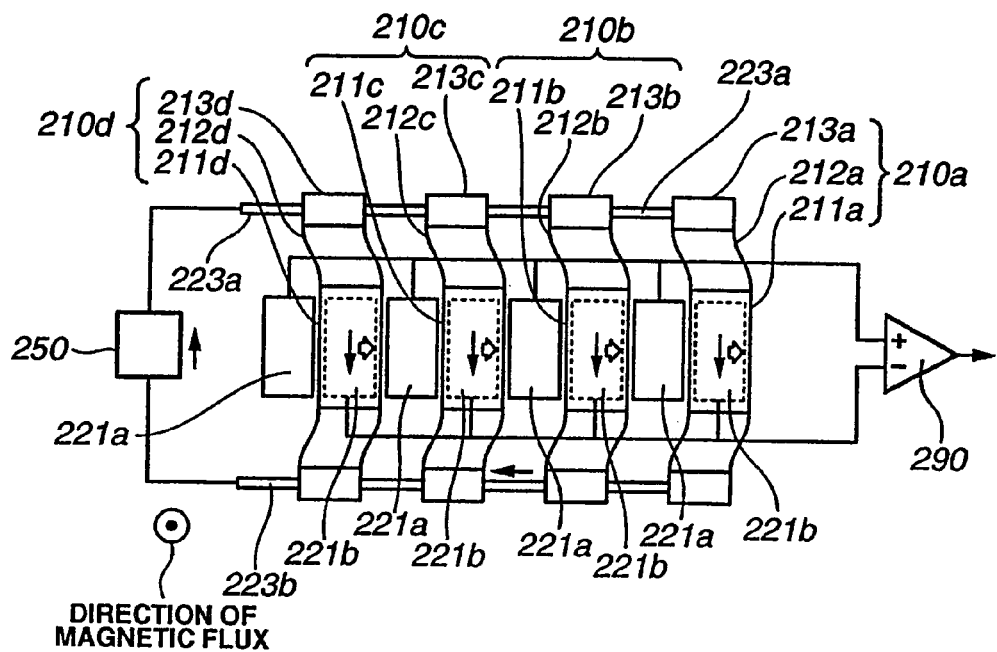
FIG. 4 is a view explaining the operation of the second embodiment.

Operation of the electric potential sensor of the second embodiment will be described with reference to FIGS. 4A and 4B. An object to be measured (a measurement object) is placed above the substrate 204 and in a direction perpendicular to the substrate 204. Under such a placement condition, in the event that current is generated from the driver 250 and is caused to flow from the driving takeout electrode 223a to the driving takeout electrode 223b as illustrated in FIG. 4A, the parallel hinge suspensions 212a to 212d are flexed, and the shielding members 211a to 211d are displaced rightward in FIG. 4A under the influence of the magnetic field generated upward perpendicularly to a sheet of the figure. The detecting electrode assembly 221a is accordingly exposed, so that the electrostatic capacitive coupling between the assembly 221a and the measurement object increases. In contrast thereto, the detecting electrode assembly 221b is shielded, so that the electrostatic capacitive coupling between the assembly 221b and the measurement object decreases.

Figure 4B:
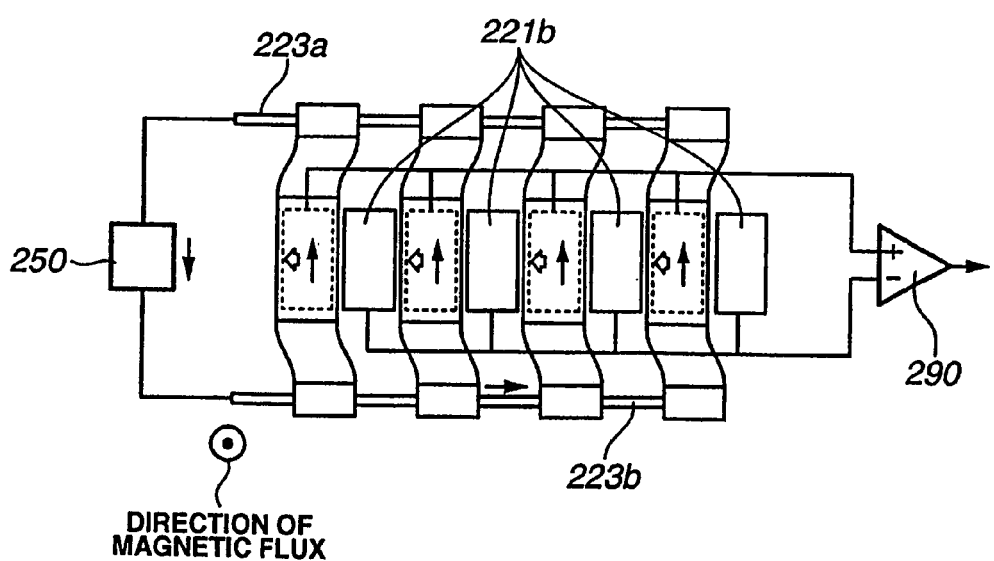

Conversely, in the event that current is caused to flow from the driving takeout electrode 223b to the driving takeout electrode 223a as illustrated in FIG. 4B, the shielding members 211a to 211d are displaced leftward in FIG. 4B. The detecting electrode assembly 221b is accordingly exposed, so that the electrostatic capacitive coupling between the assembly 221b and the measurement object increases. In contrast thereto, the detecting electrode assembly 221a is shielded, so that the electrostatic capacitive coupling between the assembly 221a and the measurement object decreases.

Upon repetition of those motions, electrical charges are induced in the detecting electrode assemblies 221a and 221b in a mutually opposite phase. An electric potential of the measurement object can be measured by differentially amplifying the charges using the differential amplifier 290.

When the driving frequency of the movable shutter units 210a to 210d is made approximately equal to the mechanical resonance frequency, electrical power needed for the driving can be reduced.

Also in a construction according to the second embodiment, the same technical advantages as those of the first embodiment can be obtained. In addition, the area of the detecting electrodes can be widened in the second embodiment. Therefore, when the size is approximately equivalent to that of a conventional sensor, the sensitivity can be improved. Further, in the event that the sensitivity only needs to be equivalent to that a conventional sensor, the size can be reduced. Moreover, the fabrication cost can be decreased by increasing the number of sensors per a silicon wafer.

Figure 5:
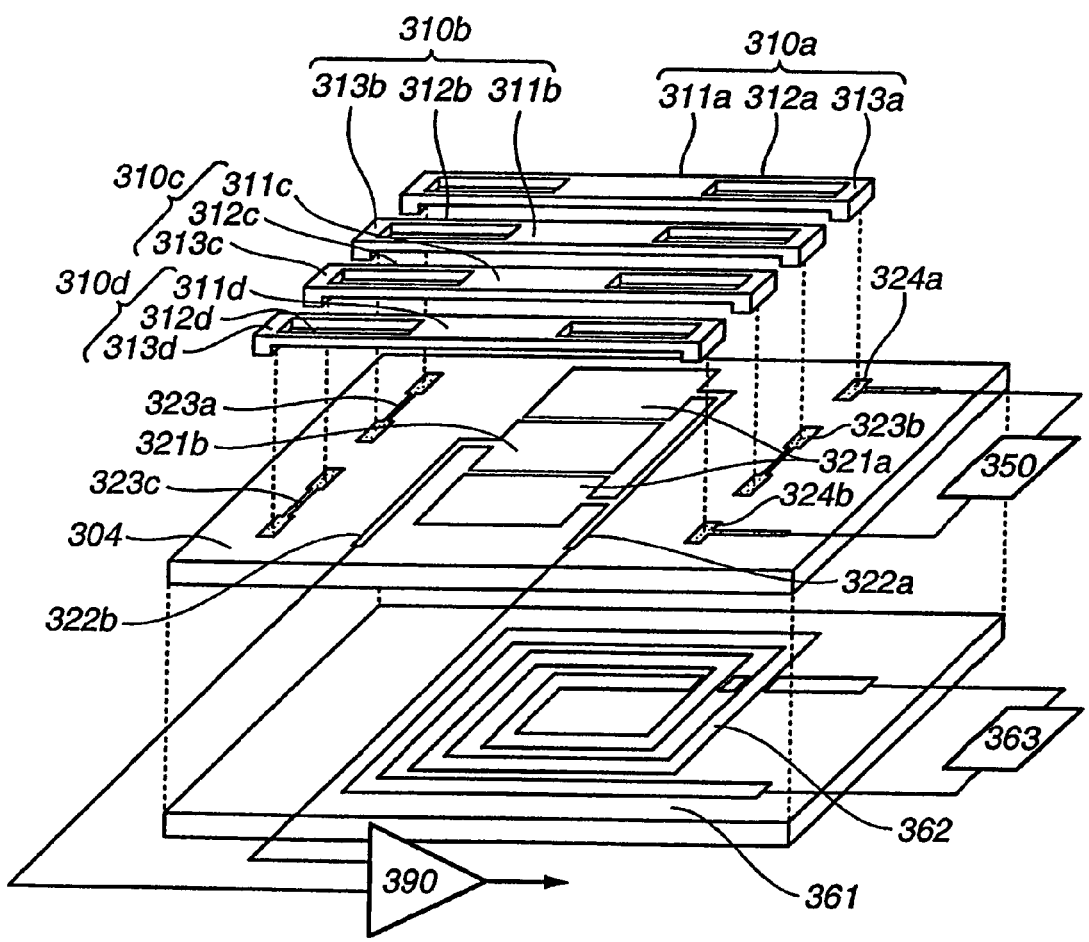
FIG. 5 is a disassembled perspective view illustrating a third embodiment of an electric potential sensor according to the present invention.

FIG. 5 illustrates a disassembled structure of a third embodiment directed to an electric potential sensor. As illustrated in FIG. 5, two detecting electrode assemblies 321a and 321b, takeout electrodes 322a and 322b for the detecting electrode assemblies 321a and 321b, coupling electrodes 323a to 323c, and takeout electrodes 324a and 324b for driving are patterned on a substrate 304. Each of the detecting electrode assemblies 321a and 321b consists of a set of detecting electrodes (only one detecting electrode of the detecting electrode assembly 321b is shown in FIG. 5) which are spaced from each other and electrically connected to each other by each of the takeout electrodes 322a and 322b for the detecting electrode assemblies 321a and 321b. Detecting electrodes of the detecting electrode assemblies 321a and 321b are spaced from each other such that they cannot be electrically shorted therebetween.

Movable shutter units 310a to 310d are comprised of shielding members 311a to 311d, parallel hinge suspensions 312a to 312d, and fixing members 313a to 313d, respectively. Those portions 311a to 311d, 312a to 312d, and 313a to 313d are formed in a united form with electrically-conductive material, respectively. Each of the fixing members 313a to 313d is fixedly bonded to the coupling electrodes 323a to 323c or the driving takeout electrodes 324a and 324b. The shielding members 311a to 311d are supported by the parallel hinge suspensions 312a to 312d with being spaced from the detecting electrode assemblies 321a and 321b disposed below the shielding members 311a to 311d, respectively. The movable shutter units 310a to 310d are electrically serially connected through the coupling electrodes 323a to 323c and the driving takeout electrodes 324a and 324b.

A coil substrate 361 is arranged under the substrate 304. A planar coil 362 is patterned on the coil substrate 361. A magnetic flux in a direction perpendicular to the substrate 304 is generated when current is injected into the planar coil 362 by a coil driver 363. The driving takeout electrodes 324a and 324b are electrically connected to a driver 350. The detecting electrode takeout electrodes 322a and 322b are electrically connected to a differential amplifier 390.

Figure 6A:
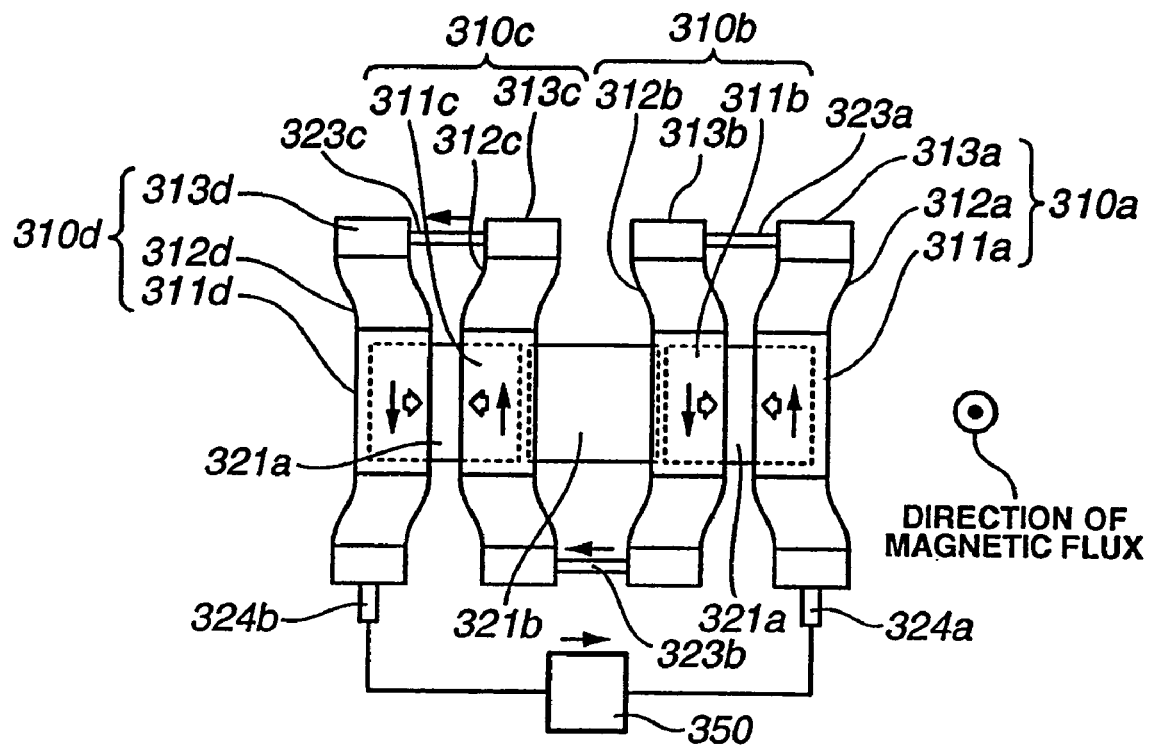
FIG. 6 is a view explaining the operation of the third embodiment.
Figure 6B:
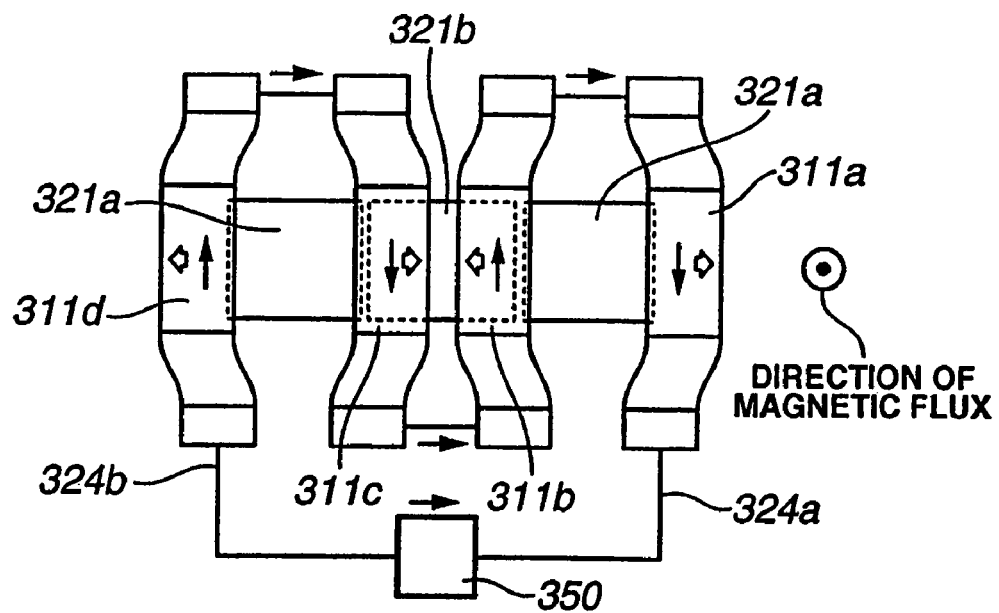

Operation of the electric potential sensor of the third embodiment will be described with reference to FIGS. 6A and 6B illustrating this embodiment viewed from above. An object to be measured (a measurement object) is placed above the substrate 304 and in a direction approximately perpendicular to the substrate 304. Under such a placement condition, in the event that current is generated from the driver 350 and is caused to flow from the driving takeout electrode 324a to the driving takeout electrode 324b as illustrated in FIG. 6A, the shielding members 311a and 311c are displaced leftward in FIG. 6A while the shielding members 311b and 311d are displaced rightward in FIG. 6A, under the influence of the magnetic field generated by the planar coil 362 upward perpendicularly to a sheet of the figure. The detecting electrode assembly 321b is accordingly exposed, so that the electrostatic capacitive coupling between the assembly 321b and the measurement object increases. In contrast thereto, the detecting electrode assembly 321a is shielded, so that the electrostatic capacitive coupling between the assembly 321a and the measurement object decreases.

Conversely, in the event that current is caused to flow from the driving takeout electrode 324b to the driving takeout electrode 324a as illustrated in FIG. 6B, the shielding members 311a and 311c are displaced rightward in FIG. 6B while the shielding members 311b and 311d are displaced leftward in FIG. 6A. The detecting electrode assembly 321a is accordingly exposed, so that the electrostatic capacitive coupling between the assembly 321a and the measurement object increases. In contrast thereto, the detecting electrode assembly 321b is shielded, so that the electrostatic capacitive coupling between the assembly 321b and the measurement object decreases.

Upon repetition of those motions, electrical charges are induced in the detecting electrode assemblies 321a and 321b in a mutually opposite phase. An electric potential of the measurement object can be measured by differentially amplifying the charges using the differential amplifier 390.

When the driving frequency of the movable shutter units 310a to 310d is made approximately equal to the mechanical resonance frequency, electrical power needed for the driving can be reduced.

Also in a construction according to the third embodiment, the same technical advantages as those of the second embodiment can be obtained. In addition, no permanent magnet is needed, and therefore, the entire size can be reduced.

Figure 7A:
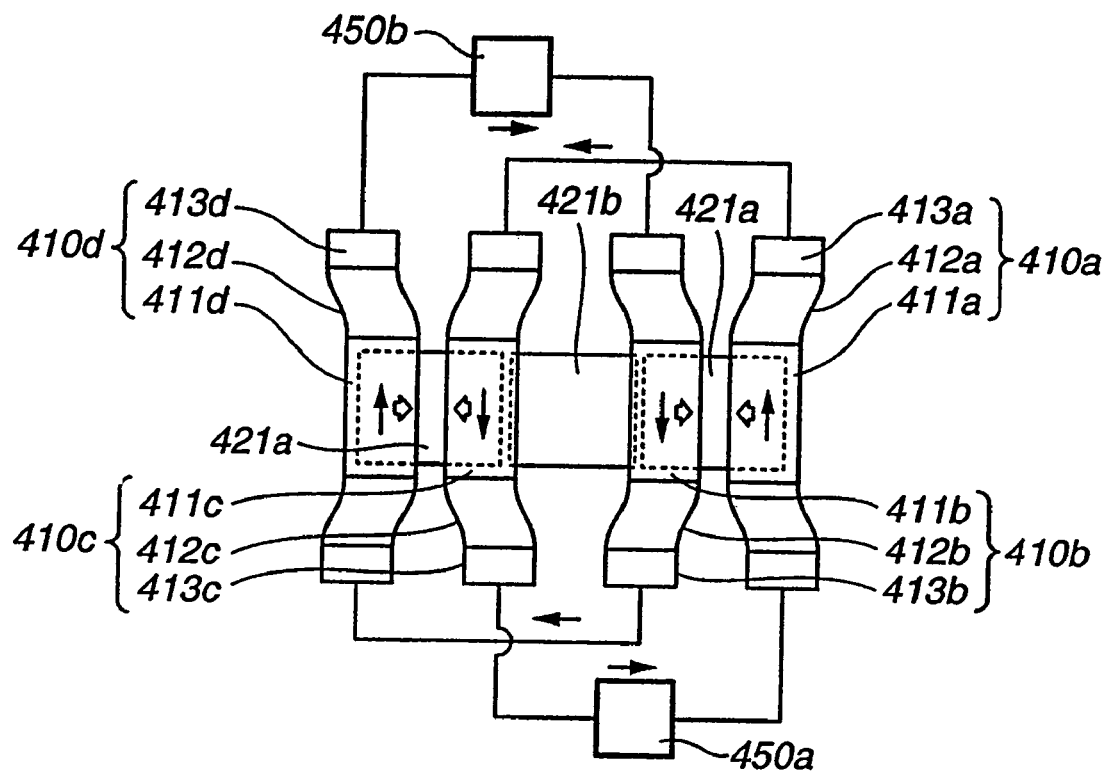
FIG. 7 is a view explaining the operation of a fourth embodiment of an electric potential sensor according to the present invention.
Figure 7B:
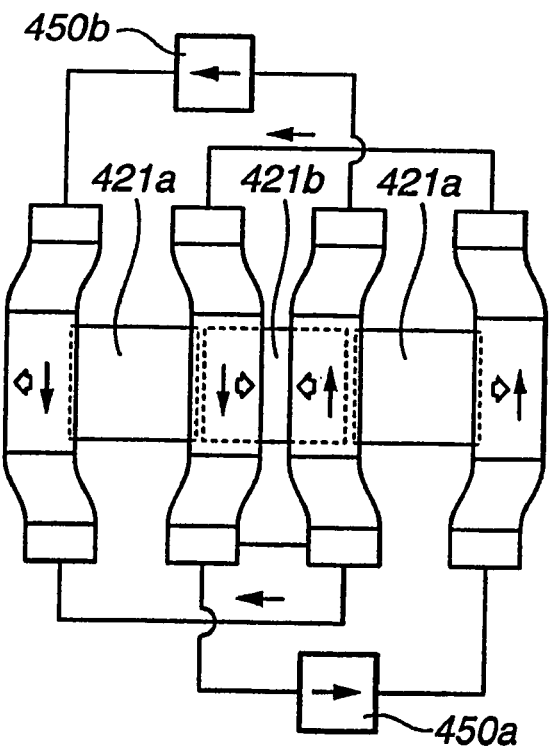

FIGS. 7A and 7B illustrate a fourth embodiment directed to an electric potential sensor. In the fourth embodiment, two detecting electrode assemblies 421a and 421b, and movable shutter units 410a to 410d are the same as those of the third embodiment.

As illustrated in FIGS. 7A and 7B, the movable shutter units 410a and 410c are electrically serially connected to a driver 450a, while the movable shutter units 410b and 410d are electrically serially connected to a driver 450b.

In the event that current is generated from the drivers 450a and 450b such that the current is caused to flow in directions as illustrated in FIG. 7A, current is caused to flow upward in FIG. 7A through the movable shutter units 410a and 410d while current is caused to flow downward in FIG. 7A through the movable shutter units 410b and 410c. Since currents flowing in the same direction repel each other and currents flowing in opposite directions attract each other, the shielding members 411a and 411c are displaced leftward in FIG. 7A while the shielding members 411b and 411d are displaced rightward in FIG. 7A. Accordingly, the detecting electrode assembly 421a is shielded, while the detecting electrode assembly 421b is exposed.

Conversely, in the event that a direction of current generated by the driver 450b is reversed as illustrated in FIG. 7B, current is caused to flow upward in FIG. 7B through the movable shutter units 410a and 410b while current is caused to flow downward in FIG. 7B through the movable shutter units 410c and 410d. Since currents flowing in the same direction repel each other and currents flowing in opposite directions attract each other, the shielding members 411a and 411c are displaced rightward in FIG. 7B while the shielding members 411b and 411d are displaced leftward in FIG. 7B. Accordingly, the detecting electrode assembly 421a is exposed, while the detecting electrode assembly 421b is shielded. Upon measuring current flowing through the detecting electrode assemblies 421a and 421b, an electric potential of the measurement object can be measured similarly to the second and third embodiments.

Also in the third embodiment, when the driving frequency of the movable shutter units 410a to 410d is made approximately equal to the mechanical resonance frequency, electrical power needed for the driving can be reduced.

Also in a construction according to the fourth embodiment, the same technical advantages as those of the above embodiments can be obtained. In addition, since two or more than two current generating units are used, no additional magnetic-field generating unit is needed, and therefore, the size and the cost can be further reduced as compared with the above embodiments.

In the above-described first to fourth embodiments, a leg portion of the fixing member in the movable shutter unit is fixedly connected to the driving takeout electrode or the coupling electrode. It is, however, possible to construct a structure in which a groove portion serving as a guide portion or a slide terminating portion is formed in each of those electrodes, and the leg portion of the fixing member is slidably fit in the guide portion or the slide terminating portion such that the movable shutter unit can be entirely slid between its detecting electrode shielding position and its detecting electrode exposing position. In this case, there is no need to provide the parallel hinge suspension portion in the movable shutter unit. The same technical advantages as above can also be obtained in such a structure.

Figure 8:
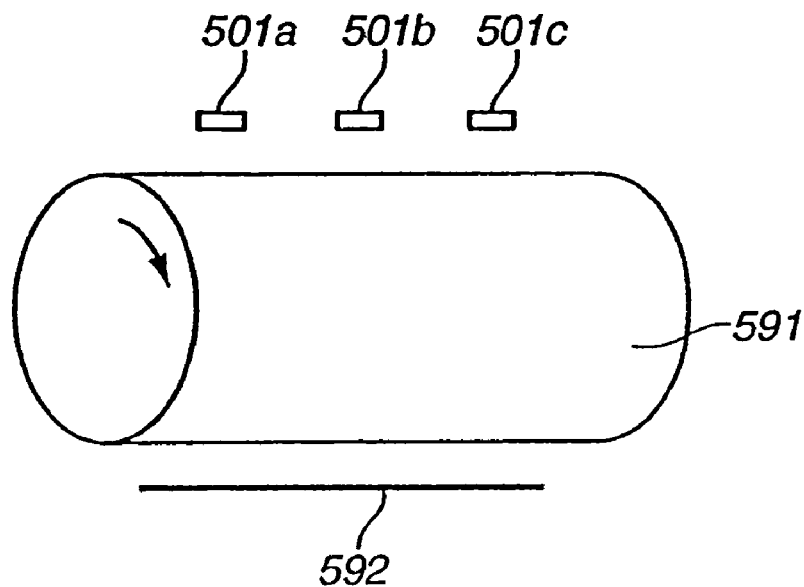
FIG. 8 is a schematic view illustrating a fifth embodiment of an image forming apparatus according to the present invention.
Figure 9:
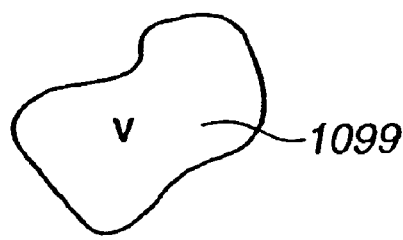
FIG. 9 is a view explaining a general operational principle of a conventional electric potential sensor of a mechanical type.
Figure 9:
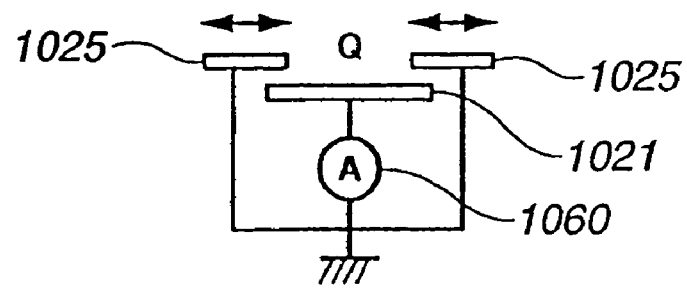
Figure 10:
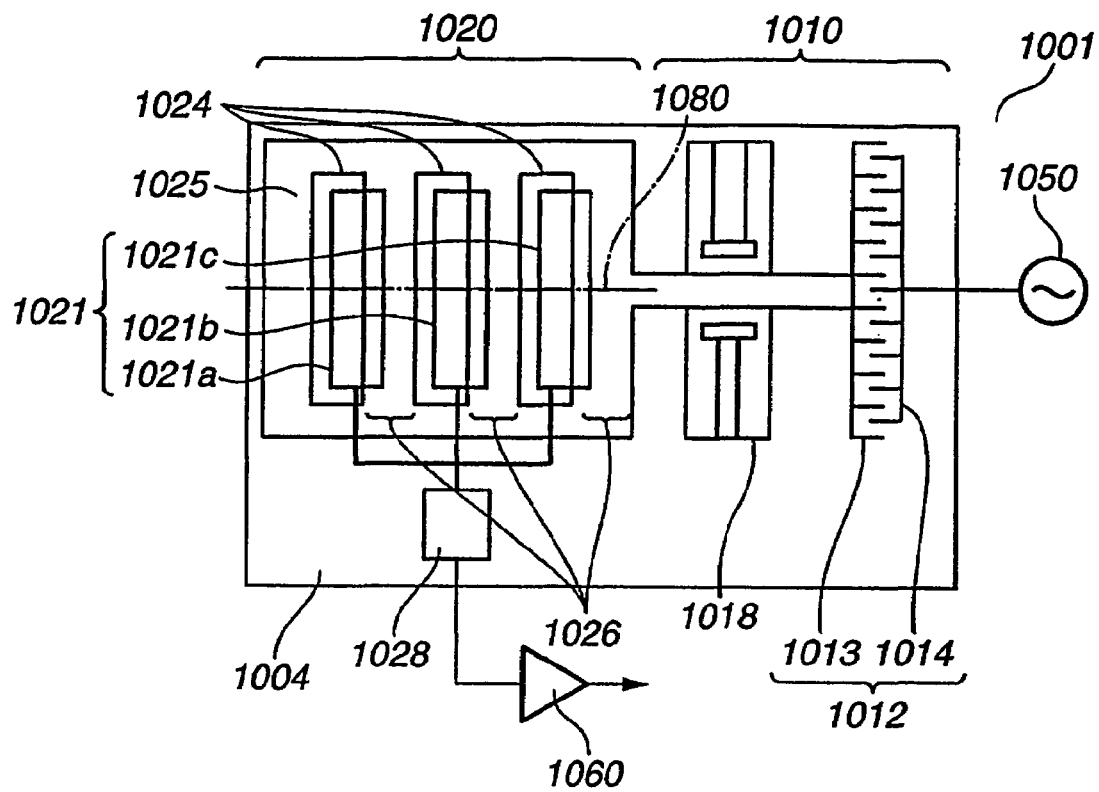
FIG. 10 is a view explaining a conventional MEMS electric potential sensor.
Figure 11:
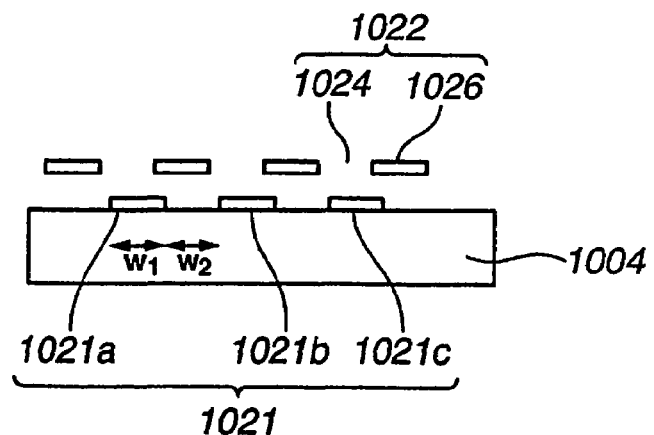
FIG. 11 is a view explaining the problem of a conventional MEMS electric potential sensor.

FIG. 8 illustrates a fifth embodiment directed to an image forming apparatus. In FIG. 8, reference numerals 501a to 501c designate electric potential sensors of the present invention, respectively. Reference numeral 591 designates a photosensitive drum generally used for electrophotographic process. Reference numeral 592 designates an electrostatic charging device. An electric potential distribution on the photosensitive drum 591 can be measured when outputs of the potential sensors 501a to 501c are monitored in synchronism with the rotation of the photosensitive drum 591. Unevenness of an image can be reduced when the amount of light exposed to the photosensitive drum 591, or the electrostatic charging device 592 is controlled based on the thus-measured electric potential distribution.

Figure 12:
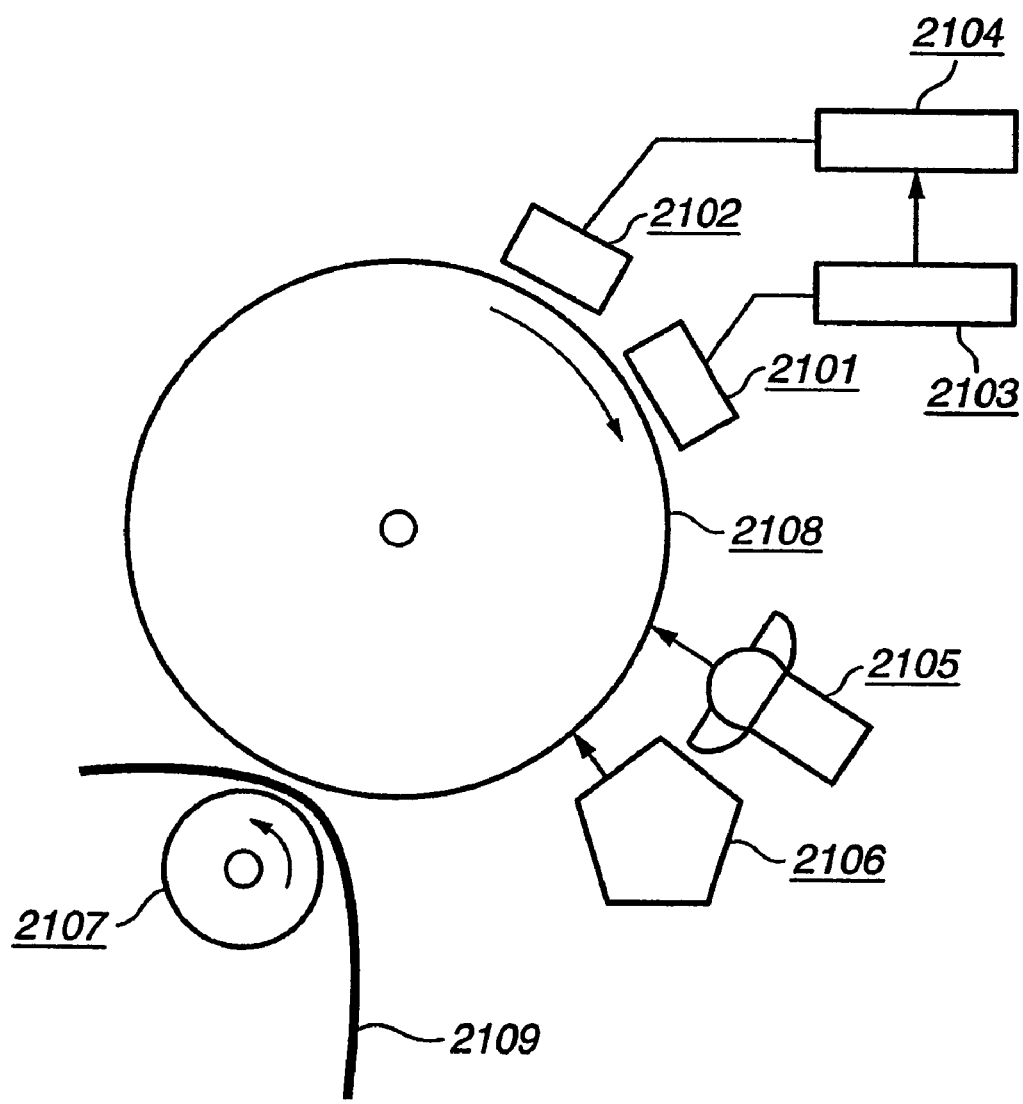
FIG. 12 is a view illustrating a circumferential structure of a photosensitive drum in an electrophotographic developing apparatus using an electric potential sensor according to the present invention.

FIG. 12 illustrates a detailed structure around the photosensitive drum of an electrophotographic developing apparatus using the potential sensor of the present invention. As illustrated in FIG. 12, an electrostatic charging device 2102, an electric potential sensor 2101, a light exposing device 2105, and a toner supplying device 2106 are arranged around a photosensitive drum 2108. The electrostatic charging device 2102 electrifies a surface of the drum 2108, and a surface of the drum 2108 is exposed to light using the exposing device 2105 to form a latent image on the drum 2108. Toner is attached to the latent image by the toner supplying device 2106 to obtain a toner image. The toner image is then transferred to a transferring material 2109 sandwiched between a transferring material conveying roller 2107 and the photosensitive drum 2108, and the toner on the transferring material 2109 is fixed. Image formation is achieved by executing those process steps.

In the above-discussed structure, a charged condition of the drum 2108 is measured by the potential sensor 2101, its signal is processed by a signal processing apparatus 2103, and the electrostatic charging device 2102 is controlled by feeding the processed, signal back to a high voltage generating device 2104. Thus, a stable electrical charging of the drum 2108 is achieved such that a stable image formation can be obtained.

As described in the foregoing, in a construction according to the present invention, an electrically-conductive movable shutter of an electric potential sensor constitutes an actuator, so that there is no need to fabricate an actuator unit in a separate form, leading to a decrease in the size. Therefore, in a case where the size is approximately equivalent to that of a conventional sensor, the sensitivity can be increased. Further, in the event that the sensitivity only needs to be equivalent to that of a conventional sensor, the size can be reduced. Moreover, the fabrication cost can be decreased by increasing the number of sensors per a silicon wafer.

In addition, since an electric potential sensor of the present invention can be reduced in its size, a lot of potential sensors can be built in an apparatus, leading to achievement of capability of a highly-precise control.

While the present invention has been described with respect to what is presently considered to be the preferred embodiments, it is to be understood that the invention is not limited to the disclosed embodiments. The present invention is intended to cover various modifications and equivalent arrangements included within the spirit and the scope of the appended claims.

What is claimed is:

1. An electric potential sensor comprising:
   a detecting electrode for detecting an electric potential;
   a shutter for changing a degree of exposure of the detecting electrode;
   a driving unit for driving the shutter; and
   a generation unit for generating a magnetic field, wherein the generation unit is a permanent magnet or an electromagnetic coil,
   wherein the driving unit includes a current supplying unit for injecting current into the shutter, and for displacing the shutter by injecting current into the shutter under the existence of a magnetic field generated by the generation unit.

2. An electric potential sensor according to claim 1, wherein the shutter is an electrically-conductive shutter which is elastically supported.

3. An electric potential sensor according to claim 2, wherein the electric potential sensor is constructed to approximately equalize a driving frequency of the electric potential with a mechanical resonance frequency of the shutter.

4. An electric potential sensor according to claim 1, wherein the current supplying unit injects current into the shutter in a direction approximately perpendicular to a driving direction of the shutter.

5. An image forming apparatus comprising:
   an electric potential sensor as recited in claim 1; and
   an image fanning unit for controlling image formation based on an output of the electric potential sensor.

6. An electric potential sensor according to claim 1, further comprising:
   a first detecting electrode and a second detecting electrode which are positioned to face a measurement object whose electric potential is to be measured; and
   a differential processing unit for differentially processing outputs supplied from the first and second detecting electrodes,
   wherein the shutter has a first state and a second state,
   wherein the first detecting electrode is exposed to the measurement object more when the shutter takes the first state than when the shutter takes the second state,
   and wherein the second detecting electrode is exposed to the measurement object less when the shutter takes the first state than when the shutter takes the second state.

7. A method for measuring an electric potential of a measurement object, the method comprising the steps of:
   providing an electric potential sensor having a detecting electrode for detecting the electric potential, a shutter for changing a degree of exposure of the detecting electrode, a driving unit for driving the shutter, the driving unit including a current supplying unit for injecting current into the shutter; and a generation unit for generating a magnetic field, wherein the generation unit is a permanent magnet or an electromagnetic coil, and
   measuring an electric potential of the measurement object by injecting current into the shutter under the existence of a magnetic field generated by the generation unit, so as to displace the shutter and change an electrostatic capacity between the measuring object and the detecting electrode.

* * * * *

UNITED STATES PATENT AND TRADEMARK OFFICE
CERTIFICATE OF CORRECTION

PATENT NO. : 7,212,007 B2  Page 1 of 1
APPLICATION NO. : 11/222837
DATED : May 1, 2007
INVENTOR(S) : Yasuda et al.

It is certified that error appears in the above-identified patent and that said Letters Patent is hereby corrected as shown below:

COLUMN 11:
Line 33, "fanning" should read -- forming --.

Signed and Sealed this

Fourth Day of March, 2008

JON W. DUDAS
*Director of the United States Patent and Trademark Office*